United States Patent

Ohtoshi et al.

[11] Patent Number: 5,949,076
[45] Date of Patent: Sep. 7, 1999

[54] CHARGED BEAM APPLYING APPARATUS

[75] Inventors: Kenji Ohtoshi, Numazu; Munehiro Ogasawara, Fujisawa; Jun Takamatsu, Asaka; Toru Koike, Tokyo; Kazuyoshi Sugihara, Yokosuka, all of Japan

[73] Assignee: Kabushiki Kaisha Toshiba, Kawasaki, Japan

[21] Appl. No.: 08/804,672

[22] Filed: Feb. 25, 1997

[30] Foreign Application Priority Data

Feb. 26, 1996 [JP] Japan .................................. 8-038258
Mar. 15, 1996 [JP] Japan .................................. 8-059756
Mar. 15, 1996 [JP] Japan .................................. 8-059763

[51] Int. Cl.$^6$ ..................................................... H01J 49/22
[52] U.S. Cl. ................................. 250/396 R; 250/505.1
[58] Field of Search ......................... 250/505.1, 396 R, 250/397, 398, 497.21

[56] References Cited

U.S. PATENT DOCUMENTS

| | | | |
|---|---|---|---|
| 3,777,211 | 12/1973 | Kuijpers | 250/396 R |
| 4,508,967 | 4/1985 | Boissel et al. | 250/505.1 |
| 4,550,258 | 10/1985 | Omata et al. | 250/505.1 |
| 5,093,577 | 3/1992 | De Poorter et al. | 250/397 |
| 5,308,989 | 5/1994 | Brubaker | 250/492.21 |
| 5,312,519 | 5/1994 | Sakai et al. | |
| 5,343,047 | 8/1994 | Ono et al. | 250/398 |
| 5,466,942 | 11/1995 | Sakai et al. | |
| 5,539,211 | 7/1996 | Ohtoshi et al. | |

*Primary Examiner*—Bruce C. Anderson
*Attorney, Agent, or Firm*—Oblon, Spivak, McClelland, Maier & Neustadt, P.C.

[57] ABSTRACT

A charged beam applying apparatus comprises a column at least having a charged beam generation section and optical system for controlling the charged beam and a chamber for holding a specimen in place which is exposed with the charged beam. At least one inner portion of the column is formed of a specific material whose an atomic number is equal or less than 22. When a contamination is cleaned off in the column through the utilization of an oxidation effect, an oxide film is sometimes formed inside the column. The electric charging of the oxide film causes a beam control error. The specific material such as the metal of the atomic number causes very much less such error. This is because such specific material involves less emission of secondary electrons and less electric charging in the oxide film formed.

17 Claims, 9 Drawing Sheets

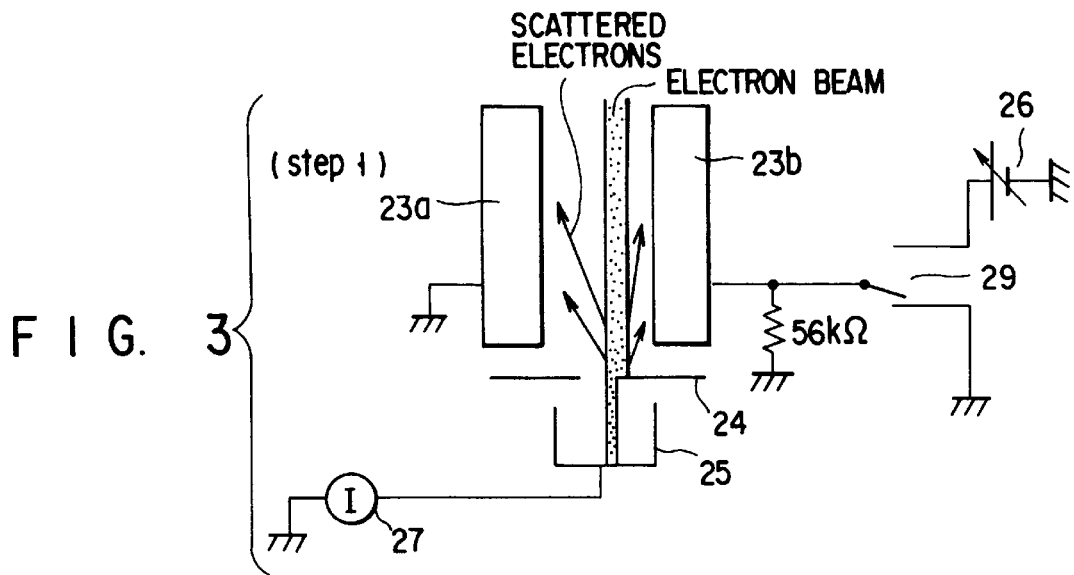
FIG. 3 (step 1)
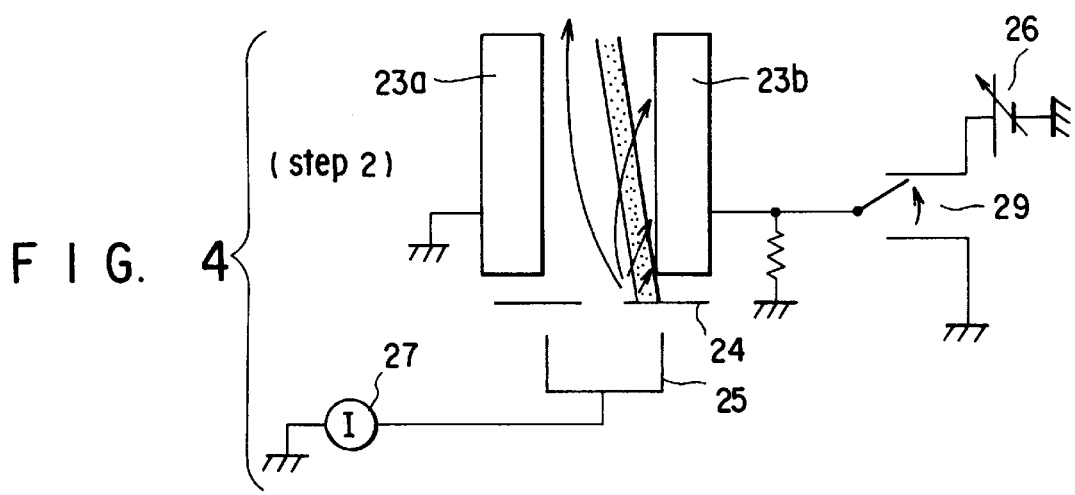
FIG. 4 (step 2)
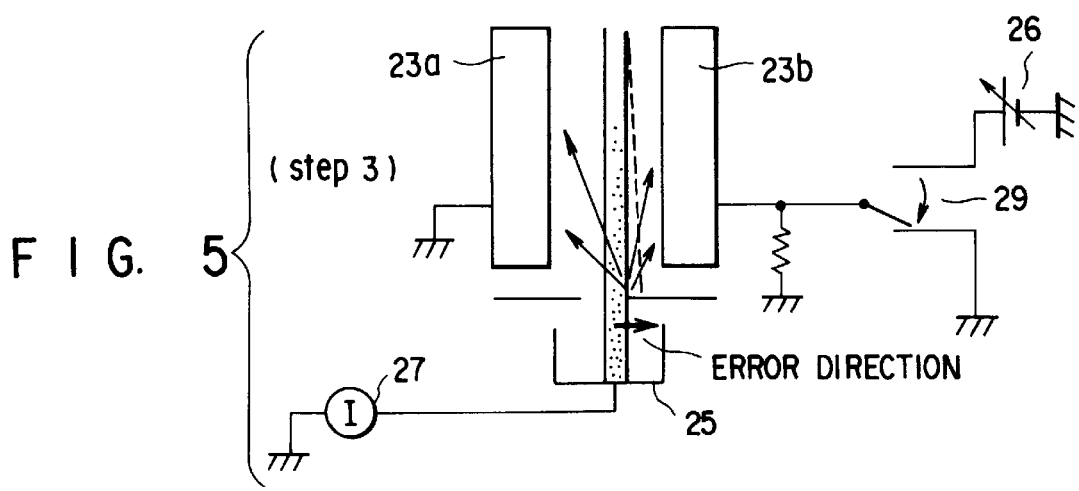
FIG. 5 (step 3)

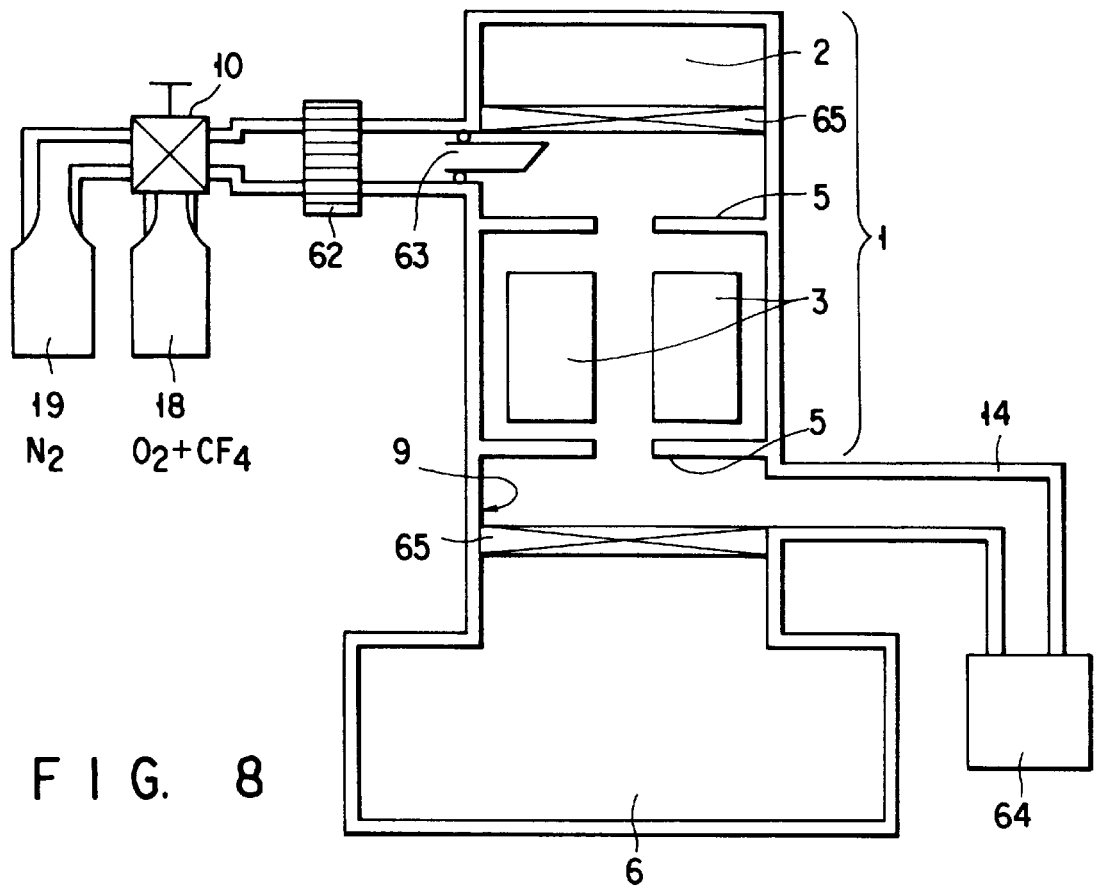
F I G. 8
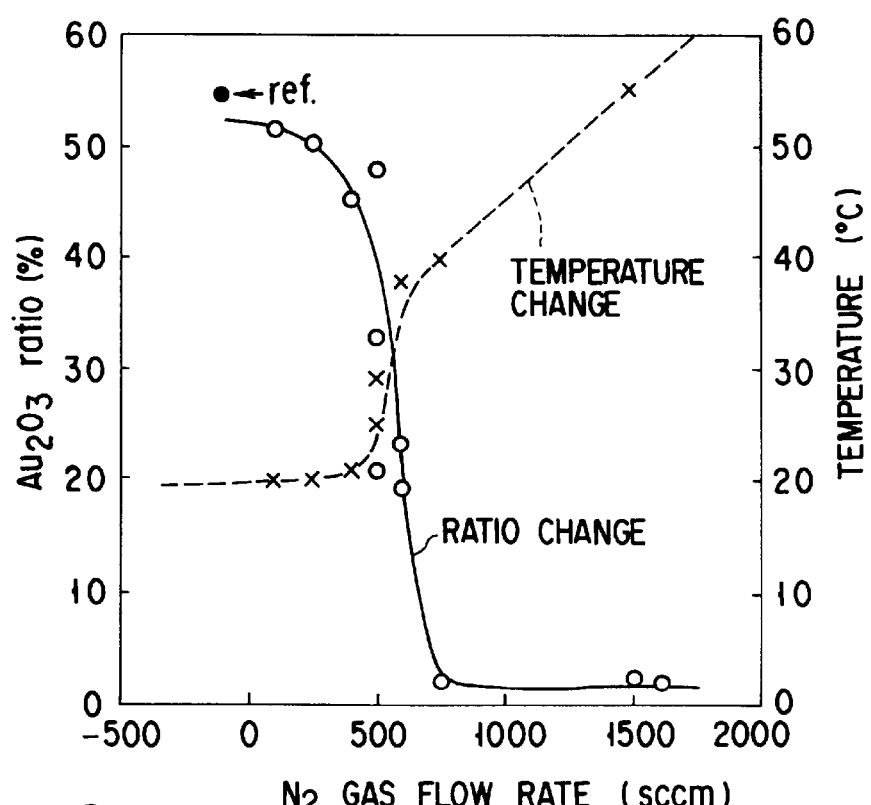
F I G. 9

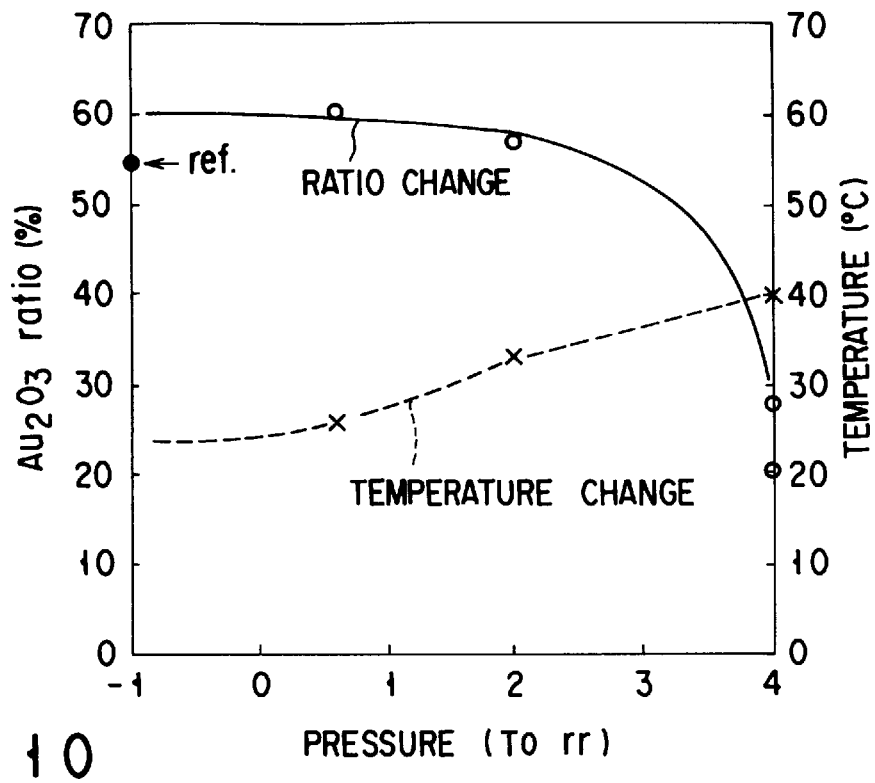
F I G. 10
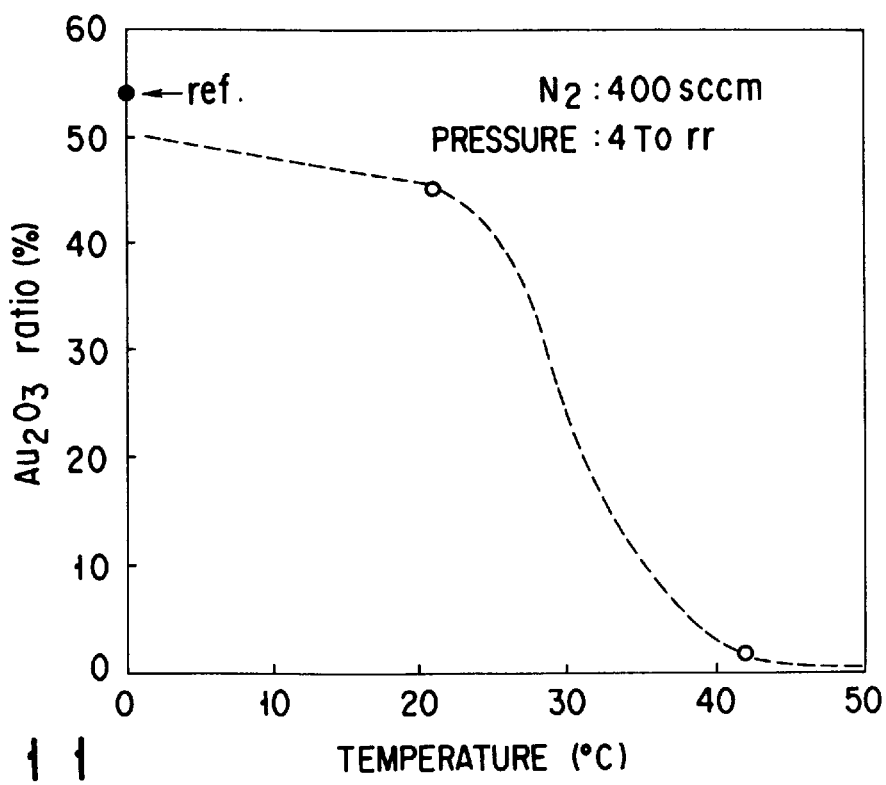
F I G. 11

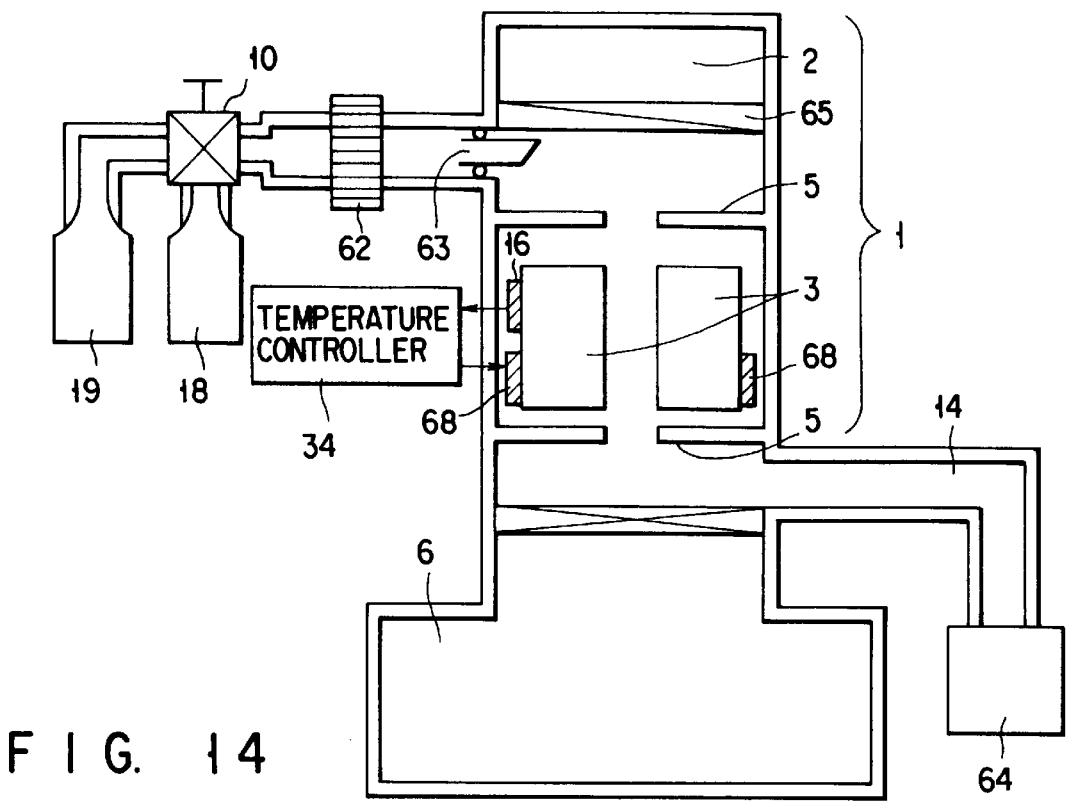
F I G. 14
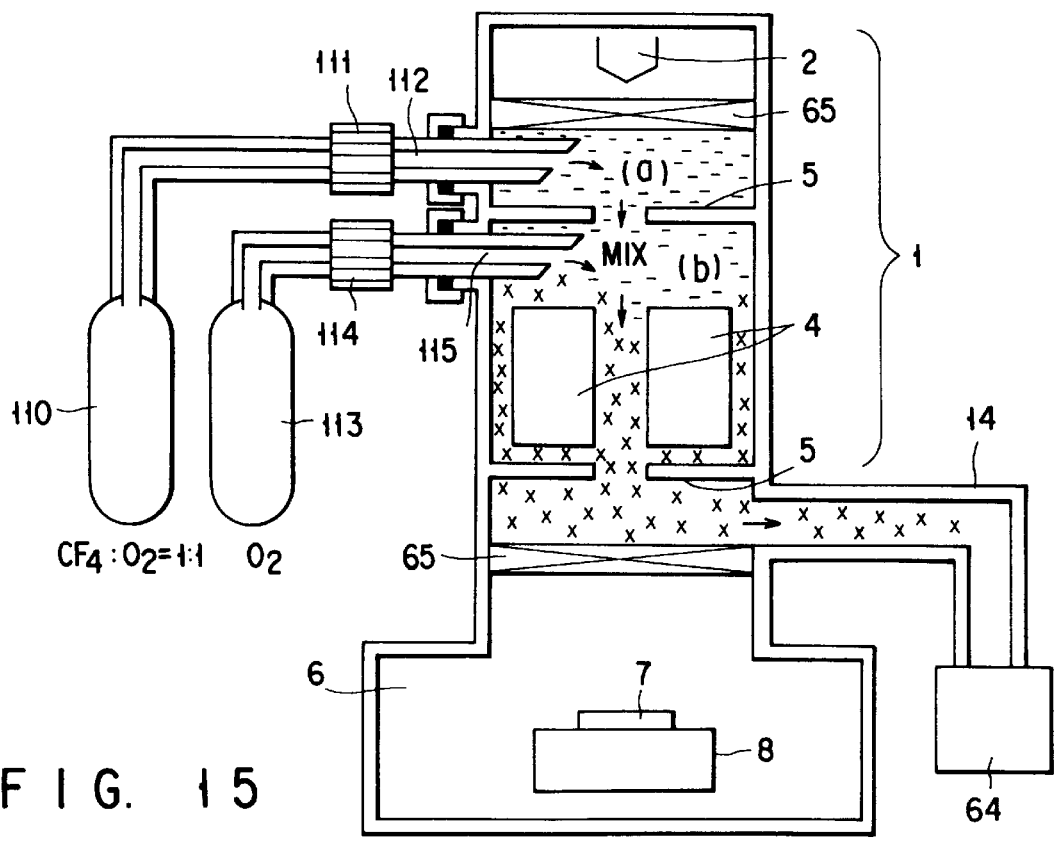
F I G. 15

CHARGED BEAM APPLYING APPARATUS

BACKGROUND OF THE INVENTION

The present invention relates to a charged beam applying apparatus utilizing charged particles such as electrons and ions and, in particular, to a charged beam applying apparatus equipped with a cleaning function and adapted to clean off a contamination through the utilization of an oxidation effect.

The photo-lithography technique mainly so far utilized as a fine pattern forming technique has been indicated, in recent years, as having a limitation on its use in those integrated circuits of a high integration density. In order to overcome such a limitation, an electron beam lithography has been quickly advanced for an electron beam exposure apparatus. In the electronic beam exposure apparatus, an electron beam emitted from an electron gun is deflected/controlled by an electrooptical system column so that a desired pattern is described on a specimen. Here, the expression "deflection" is intended to mean the changing of an electron beam path by an electrostatic field or magnetic field for instance and the expression "control" is intended to mean the focusing or shaping of the beam by an electromagnetic lens, electrostatic lens or a deflection (magnetic field, an electrostatic field) for instance. In this type of electronic beam exposure a deflection means apparatus, a hydrocarbon-based contamination is deposited on the deflection electrode sleeve, aperture, etc., through a reaction of a residual gas in the presence of scattered electrons. When the contamination is electrically charged, there arises a deflection error or aberration so that an image is described with lowered accuracy. This contamination is deposited on the electrode, sleeve, aperture, etc., even if the degree of vacuum is a high vacuum of the order of $10^{-9}$ Torrs.

With the contamination heavily deposited, the deflection error of the beam increased and image description accuracy much lowered, it is necessary to remove such contamination. In order to remove the contamination, the convention method comprises detaching the column, taking out those contaminated component parts or either cleaning them or replacing them with new component parts. This method, however, incurs costs resulting from the detachment, etc., of the column or involves a fall in operation efficiency, thus presenting a problem.

In order to suppress such a problem, the so-called in-situ cleaning technique has been newly developed which involves the detachment of the column. Such a typical in-situ cleaning method comprises utilizing an oxidation process.

Even if, therefore, the contamination is removed, there still arises a minute deflection error. It is expected that such a deflection error, being very small, will provide a possible future bar to the formation of a very fine pattern.

This may be caused by the oxide film produced by the cleaning method utilizing the oxidation process. The oxide film, being electrically charged, produces a deflection error.

Further, a native oxide film normally exists on the surface of a metal and, if being electrically charged, will produce a deflection error.

With respect to these problems it has been experimentally confirmed by the inventors that it is effective to make up component parts in the column with the use of Au or Pt. The reason is that the use of the Au or Pt involves no formation of the native oxide film and that it is simpler to remove the oxide film.

The Au or Pt is very high in cost and low in manufacturing accuracy. It may be considered that, in order to solve these problems, the Au be plated or evaporated on the surface of, for example, Ni. The solution to this problem is complex in process and, in addition, there also arises the problem that, due to the outer surface exposure of the Ni through a diffusion, an oxide film is formed on a surface.

It is, therefore, requested that the component parts of the column be formed with the use of a less charged material except for the Au and Pt. However, the relation of the material and electric charging, as well as that of the electric charging and deflection error, is unclear and there has existed no proper standard on which the material is used.

It has not thus far been possible to select any material for eliminating or reducing a deflection error resulting from the electric charging of the oxide film caused by the cleaning using the oxidation process.

It has been found that the down-flow process by a $N_2$ gas is effective to remove the oxide film of the Au and Pt. However, no clarification has been given about the conditions under which the down-flow process is effected with the $N_2$ gas. It has not been possible to remove the oxide film properly.

Further, not only the hydrocarbon-based contamination but also other substances are present in actual practice in the column. This very event goes undetected in the conventional cleaning method.

The same thing is also true of an electron beam exposure apparatus, ion beam exposure apparatus, and not only the exposure apparatus but also various types of charged beam applying apparatuses for scanning a specimen with the charged beam.

BRIEF SUMMARY OF THE INVENTION

It is accordingly one object of the present invention to provide a charged beam applying apparatus which can suppress a deflection error resulting from an oxide film produced by cleaning off a contamination with the use of an oxidation process.

Another object of the present invention is to provide a charged beam applying apparatus which can effectively clean off a plurality of kinds of contaminations.

According to a first aspect of the present invention there is provided a charged beam applying apparatus comprising a column at least having a charged beam generation section and optical system for controlling the charged beam and a chamber holding a specimen in place which is exposed with the charged beam, wherein at least one inner portion of the column is formed of a specific material selected from the group consisting of a metal having an atomic number of below 22, carbon or alloy thereof.

According to a second aspect of the present invention there is provided a charged beam applying apparatus comprising:

a column at least having a charged beam generation section and an optical system for controlling the charged beam;

a chamber holding a specimen in place which is exposed with the charged beam;

gas supply means for supplying a first gas into the column so as to clean off a first kind of contamination in the column and a second gas into the column so as to clean off a second kind of contamination produced in the column; and temperature adjusting means for adjusting a temperature in the column to equal or more than 25° C. during a time period in which the second kind of contamination is cleaned off.

According to a third aspect of the present invention there is provided a charged beam applying apparatus comprising:

a column at least having a charged beam generation section and optical system for controlling a charged beam;

a chamber for holding a specimen in place which is exposed with the charged beam;

first gas supply means for supplying a first gas via a first position into the column to allow a first area of the column to be filled with the first gas and a first kind of contamination in the first area to be cleaned off; and second gas supply means for supplying a second gas via a second position into the column to allow a second area of the column to be filled with the second gas and a second kind of contamination in the second area to be cleaned off.

According to a fourth aspect of the present invention, there is provided a charged beam applying apparatus comprising:

a column at least having a charged beam generation section and optical system for controlling a charged beam;

a chamber for holding a specimen in place which is exposed with the charged beam;

a first gas source holding a first gas for cleaning off a first kind of contamination in the column;

a second gas source holding a second gas for cleaning off a second kind of contamination in the column; and means for enabling the first and second gases to be alternately supplied into the column.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3 to 5 are explanatory views showing a measuring principle in FIG. 2;

FIG. 8 is a view in longitudinal section showing an electronic beam exposure apparatus according to a 2-1 embodiment of the present invention;

FIG. 9 is a graph showing a relation among an $N_2$ gas flow rate, inner temperature of a column and oxide film cleaning effect;

FIG. 10 is a graph showing a relation among a pressure in a cleaning area, temperature in a column and oxide film cleaning effect;

FIG. 11 is a graph showing a relation among a temperature under a constant flow rate and pressure and oxide film cleaning film;

FIG. 14 is a diagrammatic view showing an electronic view showing a 2-3 embodiment of the present embodiment;

FIG. 15 is a view in longitudinal section showing an electronic beam exposure apparatus according to a 3-1 embodiment of the present invention;

DETAILED DESCRIPTION OF THE INVENTION

The charged beam applying apparatuses of the present invention will be explained below with reference to the accompanying drawings. The cleaning function of the charged beam applying apparatus is that of eliminating a contamination in a column through the utilization of an oxidation process.

1-1 Embodiment

Figure 1:
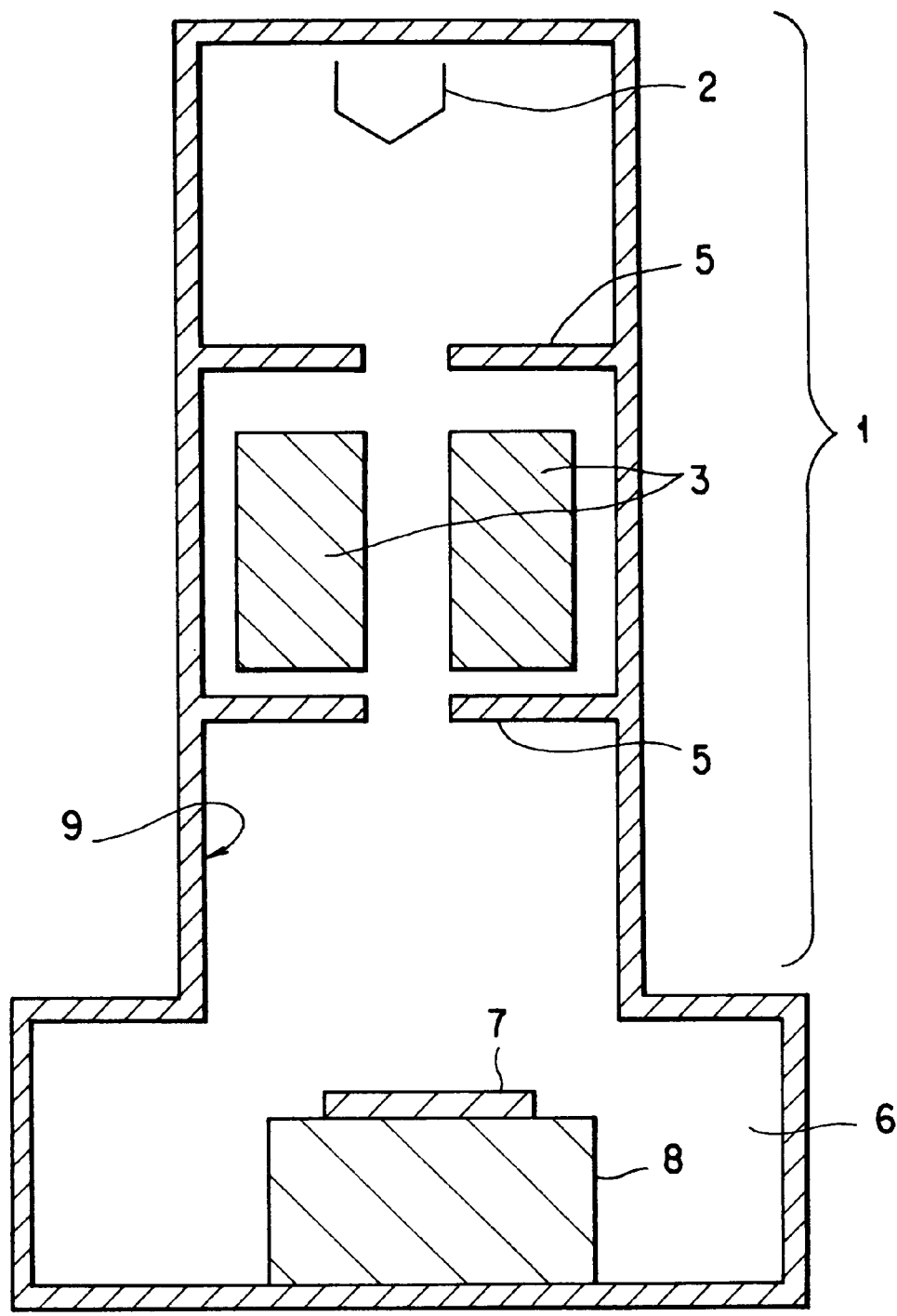
FIG. 1 is a view in longitudinal section showing an electronic beam exposure apparatus according to a 1-1 embodiment of the present invention.

FIG. 1 shows a longitudinal section showing an electronic beam exposure apparatus, equipped with a cleaning function, according to a 1-1 embodiment of the present invention. In FIG. 1, reference numeral 1 shows an electrooptical system a column (hereinafter referred to as a column) of the electronic beam exposure apparatus. Within the column are provided a beam generation section 2, such as an electronic gun, and optical system for electronic beam deflection/control. The optical system comprises an electrostatic deflection electrode 3, an aperture 5 and so on. A chamber 6 is provided in the column 1 and a stage 8 is held in the chamber 6 to locate a specimen 7 thereon. A lens coil and so on, though not shown, are held in place in the apparatus.

The electrostatic deflection electrode unit 3 is made of Ti because, due to the deflection of the beam by an electric field in the apparatus, the electric charging of the electrode unit 3 determining a potential exerts the greatest influence on the deflection accuracy.

Needless to say, the interior material of the column 1 is subjected to the process, such as degreasing and baking, before being mounted in the column.

According to the present embodiment, the electrostatic deflection electrode unit 3, being formed by Ti, can suppress the deflection error of a charged beam to substantially zero. The deflection electrode unit 3 as shown in FIG. 1 can be formed by using Al. In this case, the deflection error of the charged beam can be suppressed to the same extent as that of Au. Further, the deflection electrode 3, even being formed of C, obtains the same effect as those of Ti and Al.

The reason for the selection of these materials will be set out below.

The inventors have considered that the materials Au and Pt, being smaller in electric charging, are due to the absence of a native oxide film. For this reason, the C is first considered as the effective material for suppressing the deflection error resulting from the electric charging. For the C, there exists no native oxide film. The oxide produced by cleaning utilizing the oxidation process is volatile oxides CO and $CO_2$ and no oxide film is formed. This is the reason why the C is an effective material in the electronic beam apparatus equipped with the cleaning function utilizing the oxidation process.

For other metals usable in the column, on the other hand, the native oxide film exists and, if the cleaning using the oxidation process is carried out, there is a possibility that an oxide film will be produced.

The inventors have assumed that the electric charging will be created due to secondary electrons released from the material per se being built in the oxide film and have inferred that an electrical charging amount (deflection error magnitude) is varied by an amount of secondary electron emitted. That is, they have inferred that an amount of secondary electrons, being selected to be made smaller, can be suppressed to an small extent.

It has been known that the amount of the secondary electrons depends upon the atomic number Z of the material. The amount of the secondary electrons is produced by $2^{-a/SZ}$ with respect to an incident electron. From this formula it is considered that, since the smaller the atomic number the smaller the amount of the secondary electrons emitted, the amount of the secondary electrons decreases substantially monotonically with respect to the decrease of the atomic number Z and that the amount of deflection by the electric charging becomes smaller with a decrease in Z. However, no confirmed research has not been made on this point, that is, the relation of the deflection amount to the Z. Since no research has been made on the relation of the electric charging or deflection error to the secondary electron (atomic number), it has not been clear that, depending upon how much secondary electron amount is involved or how far the atomic number Z is positioned in the periodic table, the effect of the electric charging appears.

The inventors, making a research into the relation of the materials to the deflection error resulting from the electric charging, have found that the deflection error is greater in the atomic position of Ni and smaller in the atomic positions of Ti and Al than the Ni position in the periodic table. These materials are based on the condition that there exits a native oxide film involved.

It is also found that, if these are compared with the Au involving no oxide film, the effect is only smaller than being the same extent and is caused due to the emission of the secondary electrons. Consequently, since the emission amount of the secondary electrons exerts an influence over the deflection error, if use is made, as the material, of carbon or metal having an atomic number of below 22 or alloy thereof, it is possible to suppress the deflection error caused by the electric charging to a smaller extent and hence to maintain the beam describing accuracy.

In actual practice, such adverse effect is also caused by the amount and property of the oxide film formed of the material used and may not monotonically decrease, but it is inferred that the effect is less produced by using a material of a smaller atomic number.

Further, if the above-mentioned materials Al, Ni and Ti are subjected to the cleaning using the oxidation process, an oxide film is formed thereon which is thicker than the native oxide film. When, in this state, the deflection error resulting from the electric charging is examined, it has been found that the amount of the deflection error is largely increased for the Ni case than before the cleaning process, while, on the other hand, the deflection error is lowered, or only slightly increased for the case of Ti and Al, so that there arises almost no degradation of the describing accuracy. That is, the materials Ti and Al have been found very effective to maintain the describing accuracy on the charged beam applying apparatus equipped with the cleaning mechanism using the oxide process.

The following is the experimental method for the direct and qualitative evaluation of the above cases as well as the results of the evaluation.

Figure 2:
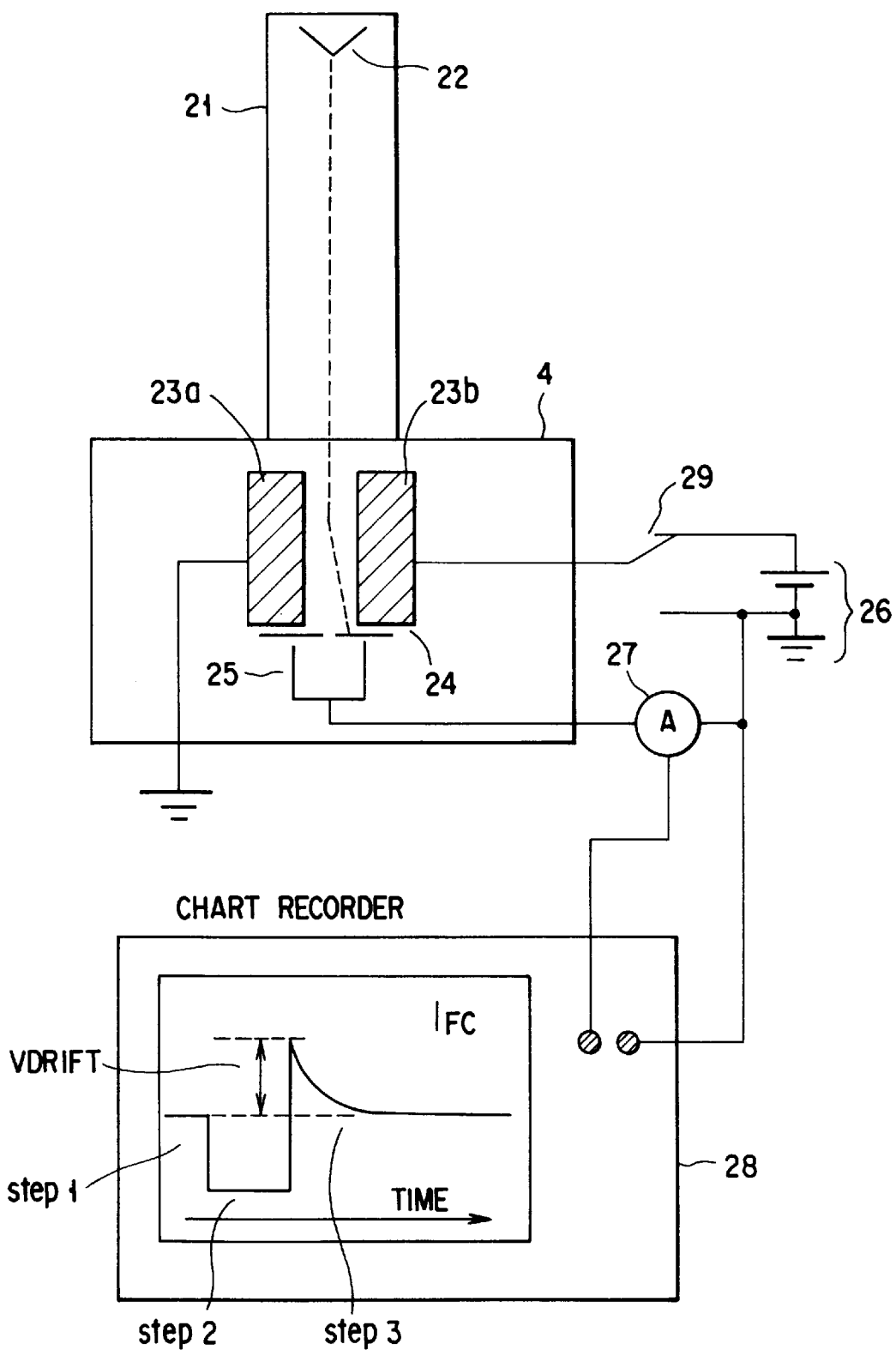
FIG. 2 is a schematic view showing an experimental apparatus for measuring electronic charging.

FIG. 2 shows a diagrammatical arrangement of an acceleration experimental apparatus used for such evaluation. In FIG. 2, reference numeral 21 shows a column; 22, an electron beam generation section; 23a, a bias deflection electrode; 24, an aperture; 25, a Faraday cup; 26, a bias current supply; 27, an ammeter; 28, a recorder; and 29, a bias switch. Hereinafter, the evaluation method using the present apparatus will be explained in brief below.

FIGS. 3 to 5 show the states of a beam at respective experimental steps. First, as shown in FIG. 3, the beam position is so adjusted as to have its portion cut off at the aperture 24. At this time, the bias switch 29 is connected to a ground side so that the electrodes 23a and 23b are set at the same level as that of the ground side (step 1).

Then, as shown in FIG. 4, the bias switch 29 is switched to a power supply side for a predetermined time to provide a potential on the electrode 23b different from that of the electrode 23a. At this time, a potential of +15 V is provided on the electrode 23b—step 2. As a result, the beam path is deflected to cause a variation in electric current in the Faraday cup 25 (a current level is OA in the present embodiment).

Further, the electrons scattered by the aperture 24 flow mainly into the electrode 23b due to a potential difference thus provided. Finally, as shown in FIG. 5, the bias switch 29 is brought back to the ground side (step 3). In the present embodiment, all electric current was about 4 $\mu$A and, at step 1, the beam position was so adjusted as to make a current value at about 1 $\mu$A. Further, a bias potential was supplied as +15 V for about three minutes.

Figure 6:
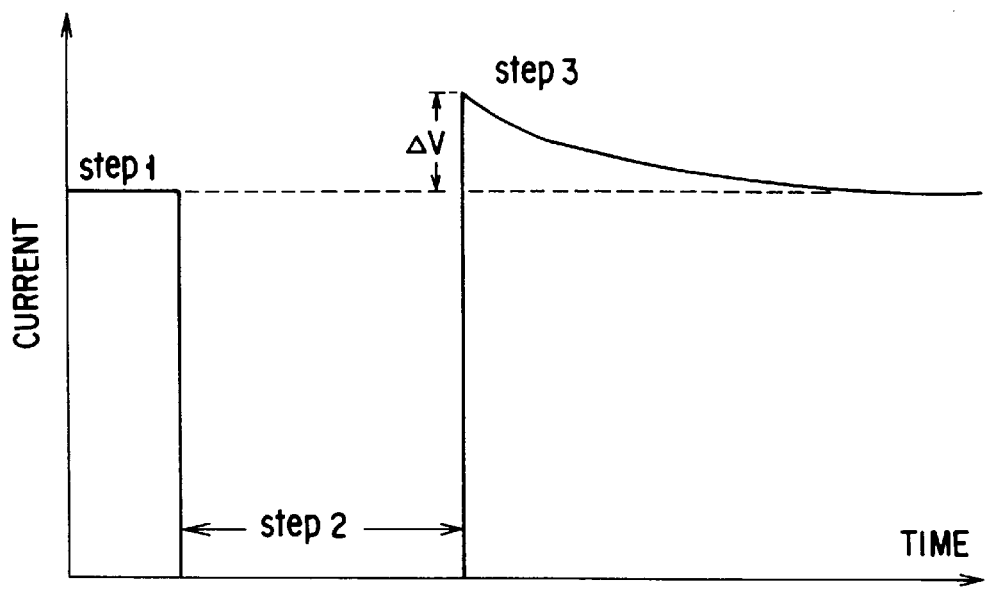
FIG. 6 is a view showing a time variation of an electric current through a Faraday cup in FIG. 2.

FIG. 6 shows a time waveform of a current recorded on the recorder 28 during experiment. In FIG. 6, the ordinate shows a value of electric current into the Faraday cup 25 and the abscissa a time. In the period of step 2 the beam is deflected and the current amount varies (OA). Next at a period of step 3, if the electrode 23 is not electrically charged, the current value should be brought back to the same current value as at the period of step 1. If, on the other hand, the electrode is electrically charged, the current value becomes different from that at step 1 depending upon the charging amount involved. With this state maintained, a discharge occurs at a given time constant and the current value converge to the same level as at step 1. As a result, the difference $\Delta V$ between the current value at step 1 and that at step 3 following step 2 shows a drift amount resulting from the electric charging.

Below is a Table 1 showing a relation between the material and the drift amount $\Delta V$ measured using the above-mentioned apparatus. The experiment was conducted under the conditions of all the current 4 $\mu$A, bias voltage 15 V and acceleration voltage 50 KeV. Further, the electrode is about 60 mm in length and $\Delta V$ shows a potential on the assumption that the electrode is uniformly charged. The materials evaluated are Au, Ni, Ti and Al before and after being subjected to a cleaning process.

TABLE 1

| Material | ΔV (charged-up level) |
| --- | --- |
| Au | 0.04 (V) |
| Au$_2$O$_3$ | 0.09 (V) |
| Ni | 0.5 (V) |
| Ni$_2$O$_3$ | 1.0 (V) |
| Al$_2$O$_3$ | 0.04 (V) |
| Ti | <0.01 (V) |
| TiO$_2$ | <0.01 (V) |

As seen from Table 1, the materials Ti and Al of the smaller atomic number are electrically charged to an extent equal to, or less than, the Au. The material Ti, in particular, is substantially zero at a charged-up level (ΔV) and very effective. In contrast, it is found that the material Ni greater in atomic number than the Ti has a greater charging amount even in a native oxide film state and that more charging amount can be obtained by being subjected to the cleaning process.

From the result above it may be considered that, where the materials whose atomic numbers are equal or less than 22 are used for the deflection electrode 23, the charging amount can be suppressed to less than that of the Au. It is, therefore, possible to suppress the deflection error to substantially zero in the case where a contamination can be completely removed. Further, in comparison with the conventional formation of the electrode, etc., with the use of the Au, it is possible to achieve less plating or evaporation steps or less underlying layer (Ni) formation step for instance and also to achieve a lower manufacturing cost.

Although, in the above-mentioned embodiment, the materials whose atomic numbers are equal or less than 22 are used for the electrode 3, these can be used at at least an inner portion of the column in which case their effect can be expected. The effect can also be gained by forming at least one portion directly visible from the beam path, or at least one portion creating an electric field, with the use of the materials having the atomic number of below 22. In this connection it is to be noted that the inner portion of the column 1 and the portion directly visible from the beam path include the beam generation section 2, electrode 3, aperture 5, inner surface material 9 of the column 1, and so on. Further, the electric field generation section includes not only the electrode 3 but also magnetic poles, electrostatic lens, etc.

Further, those charges built in the places where incoming current varies with time may be liable to be disturbed in a unstable fashion and an advantage can be gained if the materials having the atomic number of below 22 are used in these places. It is also found effective to use them at those areas where there arises no electrostatic field for the electromagnetic deflection, etc.

1-2 Embodiment

Figure 7:
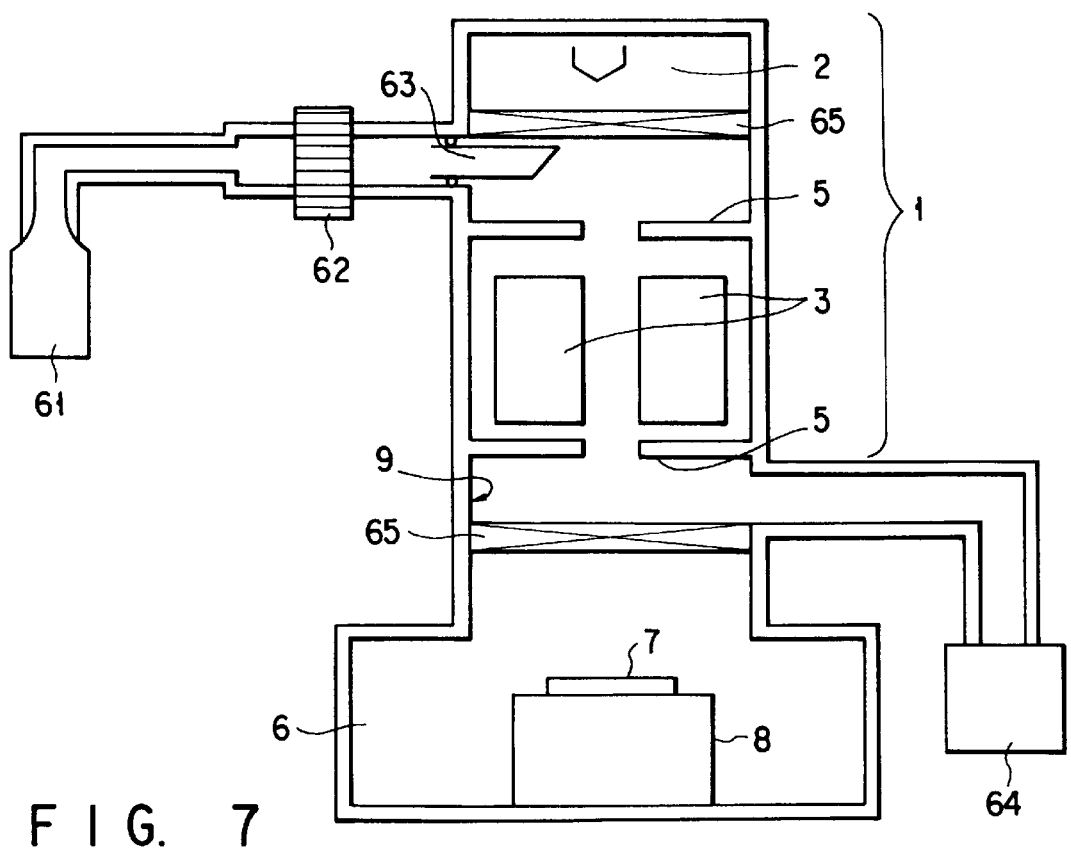
FIG. 7 is a view in longitudinal section showing an electronic beam exposure apparatus according to a 1-2 embodiment of the present invention.

FIG. 7 is a schematic view showing an electronic beam exposure apparatus according to a 1-2 embodiment of the present embodiment. In this embodiment, the same reference numerals are employed to designate parts or elements corresponding to those shown in FIG. 1 and further explanation is omitted except those parts different from those in the embodiment of FIG. 1.

The difference between this electronic beam exposure apparatus and the 1-1 embodiment is in that the apparatus of this embodiment is equipped with a cleaning mechanism for cleaning off a contamination. Reference numeral 61 shows a gas source for cleaning; 62, a radical generation section of a microwave discharge column for instance; 63, a cleaning gas inlet column; and 64, a cleaning process gas exhaust pump. By restricting a cleaning area by means of a gate valve 65 it is possible to reduce a time for recovering a vacuum state in the column after cleaning has been carried out.

Next a brief explanation will be given about the cleaning procedure to be done on the present embodiment.

First the gate valves 65 are closed whereby a cleaning area between the upper and lower gate valves 65, that is, a cleaning area including an aperture 5, electrodes and so on deposited with a contamination, is spatially defined between a chamber 6 and an area including the electron beam generation section 2. Even during a cleaning process the area including the electronic beam generation section 2 and inside of the chamber 6 are maintained in a pre-cleaning high vacuum state.

The cleaning gas is held in the gas source 61 and, at a time of cleaning, supplied from the gas source 61. The gas is activated at the radical generation section 62 to generate radicals. The radicals oxidize a hydrocarbon-based (C—H based) contamination deposited on the inner surface of the column 1 and on the aperture 5, electrodes 3 and so on and produce a volatile material such as CO$_2$. The volatile material CO$_2$ for instance is discharged by the discharge pump 64 to an outside of the column 1 and the cleaning of the contamination is completed.

The cleaning done on the present embodiment is done by a procedure utilizing an oxidation reaction of the C—H based contamination in the presence of, for example, the radicals. The gas used for this purpose is, for example, an O$_2$/CF$_4$ mixture.

When the contamination on the inner surface of the column is cleaned off on the present embodiment, oxidation occurs on the metal surfaces in the column 1, for example, on the inner surface 9 of the column 1, aperture 5, electrodes and so on. The oxide film, normally having an insulating nature, is electrically charged, thus leading to a deflection error. As evident also from the Table 1, the use of the materials of a smaller atomic number can suppress the effect by the electric charging and hence reduce a possible deflection error.

It is also possible to replace the deflection electrodes 3 in FIG. 7 with Al. In this case, the deflection error caused by the electric charging can be suppressed to the same extent as that of the electrodes using a not-oxidized Au which is evaporated as a film on the material Ni. Further, the deflection electrodes, being formed of C instead, can ensure the same effect as the materials Ti and Al.

In the case where the oxidation process is used for the cleaning of the contamination, including the not intentional but eventual oxidation by a cleaning process, it is important that the drift amount be smaller even in an oxidized state. As evident from the Table 1, if use is made of the materials Ti and Al, for instance, having an atomic number of below 22 on the present embodiment, it is possible to suppress the deflection error to a small extent even if a surface involved is oxidized by cleaning. For the material Au, it is possible to remove an oxide film relatively readily and suppress the drift amount to the same extent as the materials Ti and Al, but it is required that the oxide film be removed after the cleaning process. That is, the use of the materials Ti and Al can achieve less manufacturing steps and a low manufacturing cost with the resultant advantage.

Although, in the above-mentioned explanation, the cleaning process has been explained as using the radicals in the cleaning mechanism by way of an example, it may be done not only using a plasma but also on oxygen-containing mixed gas, ozone, etc. For the cleaning process utilizing the sputtering, it is also effective to use the proper materials having a lower atomic number.

Further, the use of the materials of a smaller atomic number is for the purpose of suppressing the electric charging. Not only the deflection electrodes but also those areas or parts liable to electric charging may be formed using the materials of a smaller atomic number. Stated in more detail, those inner areas or members formed or arranged in the column 1, such as the beam generation section 2, inner surface of the column 1, aperture 5, gate valve 65, chamber 6, stage 8 and electrodes 3, those inner areas or parts directly visible from the beam path, such as the inner surface 9 of the column 1, aperture 5, gate valve 65 and electrode 3, those areas, such as the electrode 3, involving a time varying current of incoming electrons, those areas, such as the electrode, involving an arrival of reflected electrons by the beam, those areas, such as the electrode 3, involving the generation of an electric field, and so on, may be formed of the metals having an atomic number of below 22, carbon or alloy thereof.

According to the present embodiment as set out above, even if any contamination is cleaned off with the use of an oxidation process, it is possible to suppress the electrical charging of an oxide film created thereby and hence to achieve less deflection error. Further, this also obviates the need to perform the cleaning of the oxide film. Since use is not made of any expensive material such as Au, the cleaning process is cost-saving.

2-1 Embodiment

FIG. 8 is a cross-sectional view showing an electronic beam exposure apparatus, equipped with a cleaning function, according to a 2-1 embodiment of the present embodiment. In this embodiment, the same reference numerals are employed to designate parts or areas corresponding to those shown in FIG. 7. In the column 1 are held a beam generation section 2 of an electron gun, etc., and optical system, etc., for deflecting and controlling an electron beam. The optical system comprises an electrostatic deflection electrode 3, aperture 5 and so on. A chamber 6 is provided below the column 1. A stage 8 is held within the chamber 6 to place a specimen 7 thereon. It is to be noted that a lens coil, etc., not being shown in FIG. 8, is held in place.

One gas source 18 contains, for example, an $O_2/CF_4$ mixed gas (first cleaning gas) for cleaning off a contamination. Another gas source 19 holds, for example, an $N_2$ gas (second cleaning gas) for cleaning off an oxide film. At a time of cleaning, the first or second cleaning gas is selectively supplied by a tank switching valve 10 from the corresponding gas source 18 or 19. The supplied gas is activated by a radical generation section 62, before it is introduced into the column 1, to provide radicals. The radicals are introduced from a gas inlet column 63 into a cleaning area of the column 1 at an area between gate valves 65. The radicals clean off a contamination or oxide film. An exhaust gas produced by the cleaning is discharged by a discharge pump 64 from within the column 1.

The following is a cleaning process of an electron beam exposure apparatus thus structured. At a time of a cleaning operation the gate valves 65 are closed to define a cleaning area. By doing so, the beam generation section 2 and chamber 6 are placed in a vacuum state. It is possible to shorten the time for again recovering a vacuum state all inside the column 1 after the cleaning process is finished.

First, the first gas source 18 is opened by the switching valve 10 to allow an $O_2/CF_4$ mixture to be supplied into the cleaning area via a plasma generation apparatus 62. By doing so, a hydrocarbon-based contamination (first contamination) deposited on the inner surface 9 of the column 1, as well as on the aperture 5, electrode 3, etc., is cleaned off.

By this contamination cleaning process, an oxide film such as $Au_2O_3$ is formed on the inner surface 9 of the column 1 as well as on the aperture 5 and electrode 3 and so on.

By the switching valve 10, the first gas source 18 is closed and the second gas source 19 is opened to supply an $N_2$ gas to the cleaning area through the plasma generation apparatus 62. By doing so, an oxide film formed on the inner surface 9 of the column 1, as well as on the aperture 5, electrode 3 and so on, is cleaned off.

At the time of cleaning, at least one of an amount of $N_2$ gas flowed and a pressure in the cleaning area is so adjusted as to set, to equal or more than 25° C., the temperature prevalent in the column 1, in particular, at those portions to be cleaned, that is, the temperature of the inner surface 9 of the column 1 as well as those of the aperture 5, electrode 3 and so on. By this process, the oxide film is cleaned off or removed in a better condition.

It is important to the present embodiment to, during the oxide film cleaning period, maintain the inside of the column at a temperature of equal or more than 25° C. and, taking the actual processing time into consideration, at a temperature of equal or more than 30° C.

The temperature adjustment will be explained in more detail below.

At first, the inventors considered that an oxide film was cleaned off or removed, under the action of only active gas molecules (radicals or ions for instance) in accordance with an increase in the amount of $N_2$ gas flowed or in the pressure involved.

However, the inventors have now found from the experiments done that such oxide film cleaning effect is untenable. In this experiment, the cleaning effect of the oxide film is evaluated by a ratio

[(S after/S before)×100], that is, a ratio of the surface ares (S after) of an oxide film after cleaning to the surface (S before) of that oxide film ($Au_2O_3$) before cleaning, the ratio being referred here as an [$Au_2O_3$ ratio]. This indicated that the nearer the [$Au_2O_3$ ratio] toward a [0%] the higher the cleaning effect of the oxide film. FIG. 9 shows a relation among the amount of the $N_2$ gas, temperature (the temperature at those to be cleaned) prevalent in the cleaning area and cleaning effect ($Au_2O_3$ ratio) of the oxide film. FIG. 10 shows a relation among the pressure, temperature and cleaning effect ($Au_2O_3$ ratio). From FIG. 9 it is found that the cleaning effect of the oxide film does not increase monotonically with respect to an increase in flow rate, abruptly increases in the neighborhood of 500 to 600 sccm and is saturated near 700 sccm. Further it is also found from FIG. 10 that the cleaning effect of the oxide film does not monotonically increase with respect to an increase in pressure and increases near 3 to 4 Torrs.

The temperature near the 500 to 600 sccm, that is, near the value of the $N_2$ gas flow rate at which the cleaning effect of the oxide film abruptly increases, is about 25° C. while, on the other hand, the temperature near 3 to 4 Torrs, that is, near the pressure at which the cleaning effect of the oxide film abruptly increases, is about 40° C. It is, therefore, expected that the cleaning effect of the oxide film can be better exhibited by maintaining the temperature in the cleaning area at equal or more than 25° C.

The relation of the temperature to the cleaning effect was examined under the condition that the $N_2$ gas flow rate and pressure were set to 400 sccm and 4 Torrs, respectively. The result is as shown in FIG. 11. It has been found that the cleaning effect abruptly increases at the temperature of nearly equal or more than 25° C.

Figure 12:
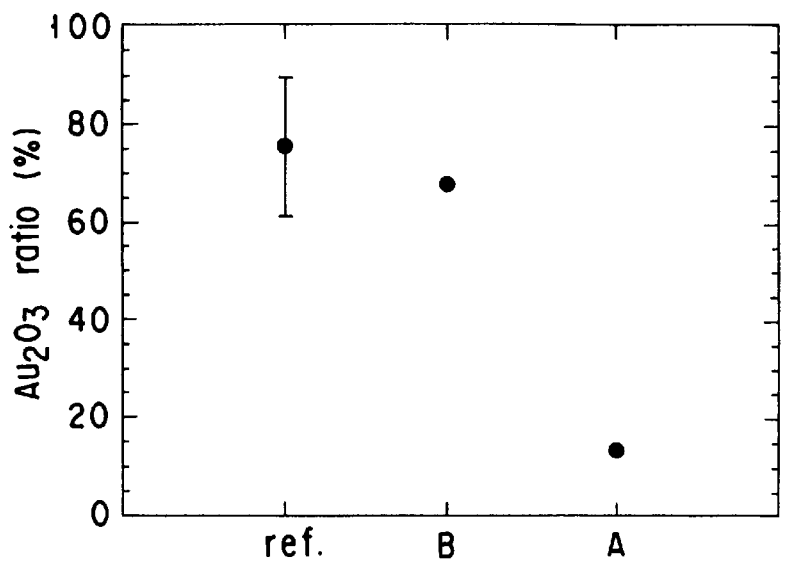
FIG. 12 is a graph showing a relation between an oxide film cleaning method and an oxide film cleaning effect.

Further, FIG. 12 shows a difference in the cleaning effect resulting from a difference in the cleaning process of the oxide film. The cleaning process uses the cleaning (A in FIG. 12) by a radical gas using $N_2$ and vacuum baking (B in FIG. 12). The temperature at the cleaning process is set to nearly 40° C. in both cases. As evident from FIG. 12, less cleaning effect is obtained with the baking only and a high cleaning effect is gained through the combination of the heating and radical gas.

From the result it has been found that the effective cleaning of the oxide film can be realized by cleaning the oxide film with the radical gas while maintaining the temperature in the cleaning area at nearly equal or more than 25° C.

Even in the case where the material Pt is formed on the surface of the area or parts to be cleaned, it is possible to obtain the same result by using the same method as in the present embodiment. Further, even when an $N_2$ contained mixture (gas) is filled into the second gas source 19 and used as a second cleaning gas, it was possible to obtain the same result as when use is made of $N_2$ only. In this connection it is to be noted that any too high a temperature be avoided because of the possibility to cause damage to the inner member of the column 1. Further, it is also not effective to raise the temperature in the cleaning area to above a level at which the cleaning effect is saturated. It is preferable to maintain the temperature in the cleaning area in a range between the temperature at which the cleaning effect is sharply exhibited and the temperature at which the cleaning effect is saturated, that is, in a range of about 25° to 40° C., taking into consideration the relation among the $N_2$ gas flow rate, temperature and cleaning effect in FIG. 9 as well as the relation among the pressure, temperature and cleaning effect in FIG. 10.

2-2 Embodiment

Figure 13:
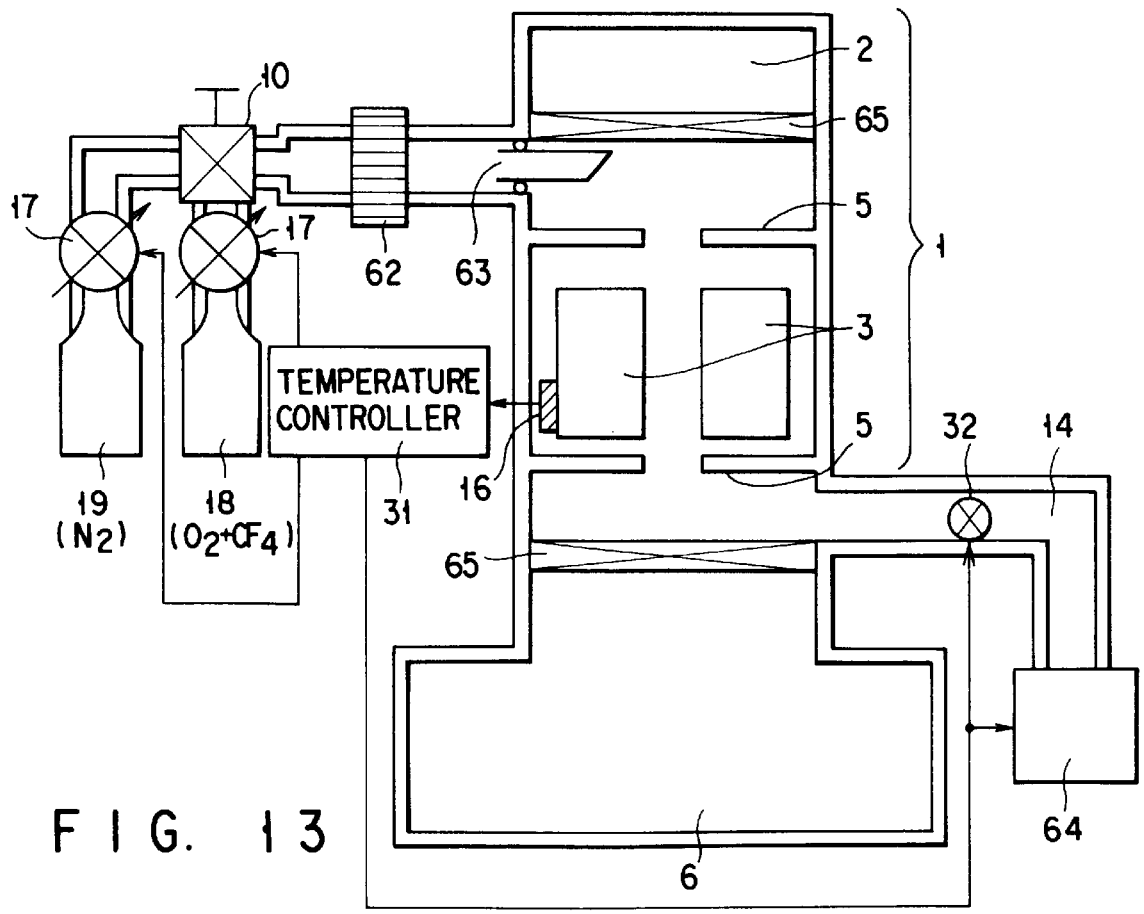
FIG. 13 is a diagrammatic view showing an electronic beam exposure apparatus according to a 2-2 embodiment of the present invention.

FIG. 13 is a diagrammatic view showing an electron beam exposure apparatus according to the 2-2 embodiment of the present invention. In FIG. 13, the same reference numerals are employed to designate areas or parts corresponding to those shown in FIG. 8. The feature of the present invention lies in that at least one of the flow rate and pressure is so adjusted that the temperature in a cleaning area during the cleaning of the oxide film is set, while being monitored, to a proper temperature range (about 25° to 40° C.) explained in connection with the embodiment 2-1.

Flow rate adjusting valves 17 are provided one at a first gas source 18 and one at a second gas source 19. The gas flow rate varies with a variation in the opening extent of the valve 17. An exhaust valve 32 is provided on an exhaust pipe 14. The pressure in the cleaning area varies in accordance with a variation in at least one of the opening extent of the exhaust valve 14 and output of the discharge pump 64.

A temperature sensor 16 is provided on the electrode 3 in the cleaning area so as to detect the temperature in the cleaning area or the temperature at the electrode 3. A temperature controller 31 monitors the temperature detected at the temperature sensor 16 and adjusts at least one of the flow rate and pressure so as to make the temperature in the cleaning area or temperature at the electrode 3 stay in a proper temperature range (about 25° to 40° C.).

For the cleaning of a hydrocarbon-based contamination, an $O_2/CF_4$ mixed gas is first introduced from the gas source 18 into the cleaning zone. In order to clean off an oxide film produced thereby, an $N_2$ gas is introduced from the gas source 19 into the cleaning area.

At this time, in order to maintain the temperature in the cleaning area, or temperature at those parts such as the electrode 3, in the proper temperature range (about 25° to 40° C.), at least one of the flow rate and pressure is adjusted. That is, when the temperature exceeds the upper level (about 40° C.) of the proper temperature range (about 25° to 40° C.), the flow rate decreases and/or the pressure falls. Or when the temperature falls below the lower value (about 25° C.) of the proper temperature range (about 25° to 40° C.), the flow rate increases and/or the pressure increases.

By achieving temperature control by adjusting the flow rate of the $N_2$ gas and/or pressure it is possible to suppress, to a minimum, the component parts or elements which would otherwise been required on the conventional apparatus.

2-3 Embodiment

FIG. 14 is a diagrammatic view showing an electronic beam exposure apparatus, equipped with a cleaning function, according to the 2-3 embodiment of the present invention. Here, the same reference numerals are employed to designate areas or parts corresponding to those shown in FIG. 13 and any further explanation thereof is omitted except in the following points. In the 2-2 embodiment, the temperature control is achieved by adjusting at least one of the flow rate and pressure, while, on the other hand, the temperature in the cleaning area or temperature at the electrode 3 is held in the proper temperature range with the use of a thermostat unit 68.

The thermostat unit 68 is equipped with at least one of a heating device, such as a heater, and cooling unit such as a cooling pipe for allowing a coolant to flow. The thermostat unit 68 is provided in the cleaning area or at the electrode 3.

The temperature controller 34 monitors the temperature detected at a temperature sensor 16 and so controls the thermostat unit 68 that the temperature in the cleaning area or temperature at the electrode 3 may stay at a proper temperature range (about 25° to 40° C.).

For the cleaning of a hydrocarbon-based contamination, an $O_2/CF_4$ mixture (gas) is first introduced from a gas source 18 into the cleaning area. Next in order to clean off an oxide film created on a surface thereby, an $N_2$ gas is introduced from a gas source 19 into the cleaning area.

When, at this time, the temperature exceeds the upper limit value (about 40° C.) of the proper temperature range (about 25° to 40° C.), heating is stopped and/or cooling is started. Further, when the temperature falls below the lower value (about 25° C.) of the proper temperature range (about 25° to 40° C.), the heating is started and/or cooling is stopped.

According to the embodiments 2-1, 2-2 and 2-3 embodiments, it is possible to effectively clean off the oxide film while maintaining the temperature in the cleaning area or temperature at the electrode 3, etc., in the proper range.

Further, the apparatus is prevented from being damaged since there is no excessive rise in the temperature in the cleaning area.

3-1 Embodiment

The present embodiment relates to the cleaning of a contamination. FIG. 15 is a diagrammatic view showing an electron beam apparatus, equipped with a cleaning function, according to the 3-1 embodiment of the present invention. In the present embodiment, the same reference numerals are employed to designate an area or parts corresponding to those in FIG. 14. A first gas source 110 holds a first gas therein and the first gas consists of a 1:1 $CF_4/O_2$ mixed gas. On the other hand, a second gas source 113 holds a second gas therein consisting of $O_2$.

A first plasma generation section 111 activates the first gas from the first gas source 110 while, on the other hand, a second plasma generation section 114 activates the second gas from the second gas source 113.

The first gas activated at the first plasma generation section 111 is supplied via a first gas inlet column 112 and from a first position into the cleaning area defined between gate valves 65, the first position being defined between the upper gate valve 65 and the upper aperture 5. On the other hand, the second gas activated at the second plasma generation section 114 is supplied via the second gas inlet column 115 and from a second position into the cleaning area, the second position being defined between the upper aperture 5 and the electrodes 3.

A resultant exhaust gas is exhausted from a position between a lower aperture 5 and a lower gate valve 65 via an exhaust pipe 14, by an discharge pump 64, such as a dry pump and rotary pump, toward an outside.

By defining the cleaning area relative to the gate valves 65 in a column 1, it is possible to, during cleaning, maintain an area other than the cleaning area in a vacuum state of $0^{-7}$ Torrs and, after the cleaning, shorten the time for recovering a high vacuum level all in the column 1.

Explanation will now be given about the operation and features of the apparatus according to the present embodiment. From the result of analysis the inventors have been found that the kinds of contaminations differ from place to place in the column 1. In particular, an $SiO_2$ is deposited at the aperture 5 and a hydrocarbon-based contamination is deposited on the electrode 3.

Here, upon the simultaneous introduction of the first and second gases into the cleaning area, a zone (a) defined above the upper aperture 5 is filled with a first gas, that is, the 1:1 $CF_4/O_2$ mixed gas. By doing so, the contamination ($SiO_2$) above the upper aperture 5 is cleaned off effectively.

Further, the second gas is mixed with the first gas coming from the upper aperture 5, that is, with the first gas in the second position defined between the aperture 5 and the electrode 3. As a result, a zone (b) including the electrode 3 is filled with the first/second gas mixture.

It is important that the flow rates of the first and second gases be relatively adjusted so as to set, to about 1:10 to 1:30, a ratio between the $CF_4$ and the $O_2$ in the first/second gas mixture. It is found effective to etch away a hydrocarbon-based contamination on the electrode 3 with the use of the mix ratio between the $CF_4$ and the $O_2$ in the first and second gas mixture.

In such embodiment, two kinds of gases in a different ratio are introduced from the different positions into the cleaning area and, by doing so, it is possible to simultaneously clean off two kinds of contaminations effectively.

3-2 Embodiment

Figure 16:
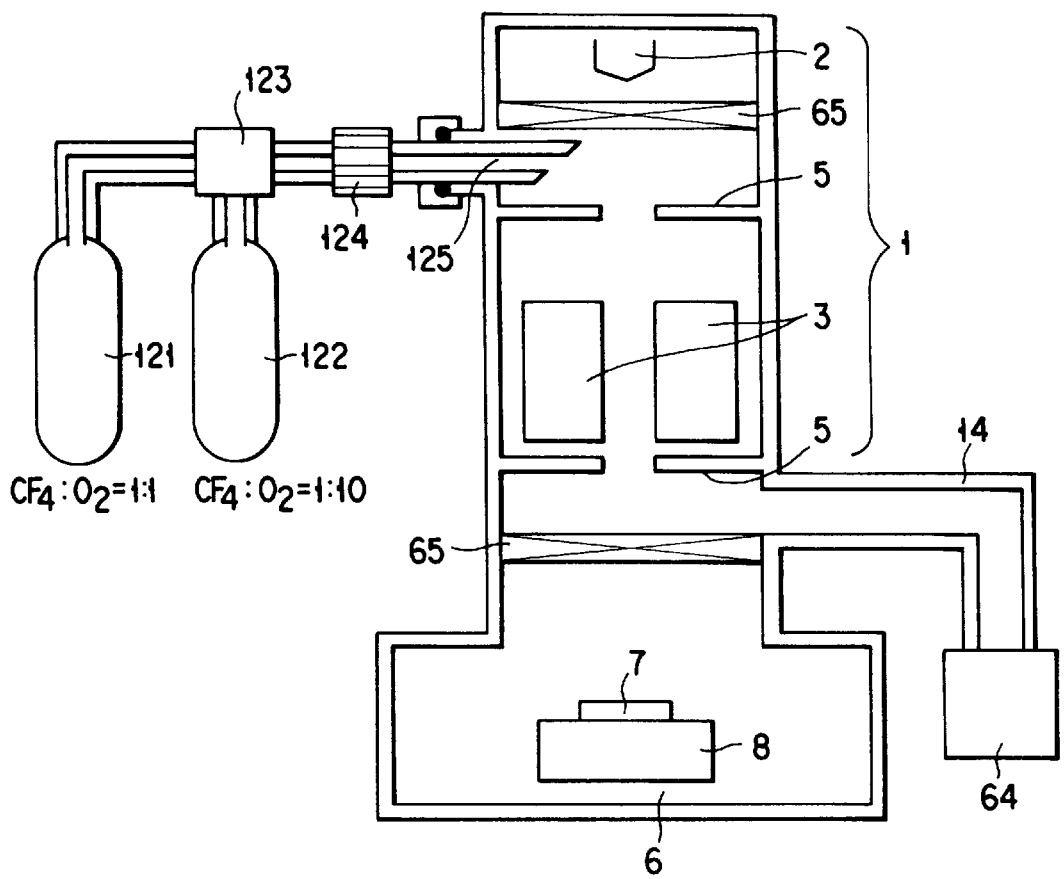
FIG. 16 is a diagrammatic view showing an electronic beam apparatus according to a 3-2 embodiment of the present invention.

FIG. 16 is a diagrammatic view showing an electron beam exposure apparatus, equipped with a cleaning function, according to the 3-2 embodiment of the present invention. Here, the same reference numerals are employed in FIG. 16 to designate an area or parts corresponding to those shown in FIG. 15 and any full explanation thereof is omitted for brevity's sake. A first gas source 121 holds, therein, a 1:1 $CF_4/O_2$ mixed gas (a first mixed gas), while, on the other hand, a second gas source 122 holds, therein, a $CF_4/O_2$ mixed gas (a second mixed gas) having a mix ratio of 1:10 to 1:30 between the $CF_4$ and the $O_2$. These two kinds of gases are introduced into a cleaning area via a shared plasma generation section 124 and shared gas column 125.

Figure 17:
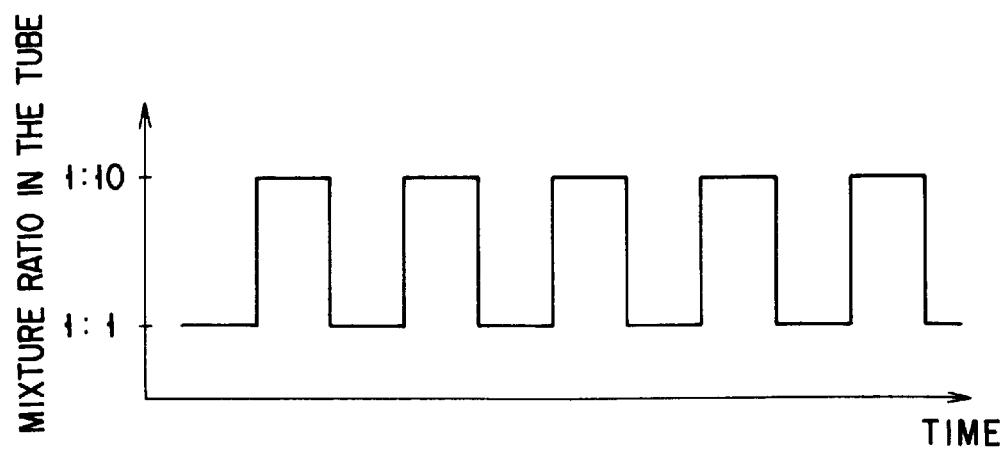
FIG. 17 is a view showing time variation of a mix ratio of a cleaning gas in the 3-2 embodiment of the present invention.

As shown in FIG. 17, the first and second mixed gases are alternately introduced by the switching device 123 into the cleaning zone during a contamination cleaning period. An $SiO_2$ contamination is effectively cleaned off by the first mixed gas. On the other hand, a hydrocarbon-based contamination is effectively cleaned off by the second mixed gas.

According to the present embodiment, the effective cleaning of the two kinds of contaminations is achieved by the alternate use of these gases. Since the plasma generation section and gas inlet column are shared by the two kinds of gases, a resultant structure can be simplified.

It is, therefore, possible, according to the present embodiment, to use such gases as not mixable as the first and second gases in the 3-1 embodiment. For example, $F_4$ may be used as the second gas. Since, according to the present embodiment, the two kinds of gases can be alternately supplied into the cleaning area, the present embodiment can effectively be applied to the case where two kinds of contaminations are deposited at the same spots. Further, there is no possibility that a contamination will be prevented from being cleaned off due to the formation of a protective film on the contaminated surface during the cleaning of the contamination. The present invention can also be effectively applied to the case where the two kinds of contaminations are deposited one above the other.

The plasma generation section and gas inlet column, being shared by the two kinds of gases in the present embodiment, may be provided separately. Further, the switching period of the first and second gases may be adjusted or the supplying periods of the first and second gases may be adjusted separately.

Although, according to the present embodiment, alternate cleaning is carried out with the use of the two kinds of gases having a different mix ratio of the $CF_4$ and $O_2$, it may be done while continuously varying the mixed ratio of the gases. For example, a mix ratio of a $CF_4$ gas in one gas source and $O_2$ gas in another gas source prepared can be continuously varied by continuously varying the flow ratio between the $CF_4$ gas and the $O_2$ gas.

The present invention is not restricted to the above-mentioned electronic beam exposure apparatus and can be applied to an ion beam exposure apparatus. Further, the present invention can be applied not only to the exposure apparatus but also to an electron microscope for applying a charged beam under deflection to a specimen, scanning electron microscope (SEM) and charged beam applying apparatus, such as a focusing ion beam machining apparatus. Further, a contamination deposited on a mirror, window, etc., in an apparatus using a charged beam or an X-ray or excimer laser can be removed from a surface by the same system as that of the apparatus of the present embodiment set out above. Or the optical system may be of a type different from the system as set out above.

Various changes or modifications of the present invention can be made without departing from the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A charged beam applying apparatus comprising:
   a column at least having a charged beam generation section, an optical system for controlling the charged beam, and a chamber holding a specimen in place which is exposed with the charged beam, wherein said optical system includes a deflection electrode formed of a specific material selected from the group consisting of Al and Ti.

2. A charged beam applying apparatus according to claim 1, further comprising cleaning means for supplying a corresponding gas into the column and for cleaning off the contamination an oxidation effect with the gas.

3. A charged beam applying apparatus according to claim 1, further comprising means for spatially defining a cleaning area of the column relative to a remaining area.

4. A charged beam applying apparatus according to claim 1, wherein the specific material includes Ti.

5. An apparatus according to claim 1, wherein a surface of the deflection electrode is made of oxidized aluminum or oxidized titanium.

6. A charged beam applying apparatus comprising:
   a column at least having a charged beam generation section and an optical system for controlling a charged beam;
   a chamber for holding a specimen in place which is exposed with the charged beam;
   first gas supply means for supplying a first gas via a first position into the column to allow a first area of the column to be filled with the first gas and a first kind of contamination in the first area to be cleaned off; and
   second gas supply means for supplying a second gas via a second position into the column to allow a second area of the column to be filled with a first mixed gas of the first gas and the second gas and a second kind of contamination in the second area to be cleaned off.

7. A charged beam applying apparatus according to claim 6, wherein the first area includes an aperture for restricting the charged beam and the second area includes an electrode unit for deflecting the charged beam.

8. A charged beam applying apparatus according to claim 6, wherein the first kind of contamination comprises an $SiO_2$ and the second kind of contamination comprises a hydrocarbon-based contamination.

9. A charged beam applying apparatus according to claim 8, wherein the first gas consists of a $O_2/CF_4$ mixed gas having a 1:1 mix ratio between the $O_2$2 and the $CF_4$ and the first mixed gas consists of a $O_2/CF_4$ mixed gas having a 1:10 to 1:30 mix ratio between the $O_2$ and $CF_4$.

10. A charged beam applying apparatus according to claim 6, wherein the first gas consists of a mixture of a 1-1-th gas and 1-2-th gas and a second gas consists of the 1-1-th gas.

11. A charged beam applying apparatus according to claim 10, wherein a flow rate of the first gas and flow rate of the second gas are so set that a mix ratio between the 1-1-th gas and the 1-2-th gas in the first mixed gas is made at a predetermined ratio.

12. A charged beam applying apparatus according to claim 6, wherein the first gas consists of a second mixed gas having a 1-1-th gas and 1-2-th gas in a first mix ratio and the second gas consists of a third mixed gas having the 1-1-th gas and 1-2-th gas in a second mix ratio.

13. A charged beam applying apparatus according to claim 12, wherein a flow rate of the first gas and flow rate of the second gas are so set that a mix ratio of the 1-1-th gas and 1-2-th gas for the first mixed gas is made at a predetermined value.

14. A charged beam applying apparatus comprising:
   a column at least having a charged beam generation section and an optical system for controlling a charged beam;
   a chamber for holding a specimen in place which is exposed with the charged beam;
   a first gas source holding a first gas for cleaning off a first kind of contamination in the column;
   a second gas source holding a second gas for cleaning off a second kind of contamination in the column; and
   means for enabling the first and second gases to be alternately supplied into the column such that the first gas is supplied at least twice during a single contamination cleaning period.

15. A charged beam applying apparatus according to claim 14, wherein the first kind of contamination comprises an $SiO_2$ and the second kind of contamination comprises a hydrocarbon-based contamination.

16. A charged beam applying apparatus according to claim 15, wherein the first gas comprises a 1:1 $O_2/CF_4$ mixed gas and the second gas comprises an $O_2/CF_4$ mixed gas having a mix ratio of 1:10 to 1:30 between the $O_2$ and $CF_4$.

17. A charged beam applying apparatus according to claim 15, wherein the first gas comprises an $O_2/CF_4$ mixed gas and the second gas comprises an $F_2$ gas.

* * * * *